US009305796B2

(12) United States Patent
Chatterjee et al.

(10) Patent No.: US 9,305,796 B2
(45) Date of Patent: Apr. 5, 2016

(54) METHODS FOR ETCHING SILICON USING HYDROGEN RADICALS IN A HOT WIRE CHEMICAL VAPOR DEPOSITION CHAMBER

(71) Applicant: APPLIED MATERIALS, INC., Santa Clara, CA (US)

(72) Inventors: Sukti Chatterjee, Cupertino, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/533,389

(22) Filed: Nov. 5, 2014

(65) Prior Publication Data

US 2015/0126041 A1 May 7, 2015

Related U.S. Application Data

(60) Provisional application No. 61/900,160, filed on Nov. 5, 2013.

(51) Int. Cl.
*H01L 21/3065* (2006.01)
*H01L 21/02* (2006.01)
*H01L 21/306* (2006.01)
*H01L 21/311* (2006.01)
*H01L 21/3213* (2006.01)
*H01L 21/67* (2006.01)
*H01L 21/3105* (2006.01)

(52) U.S. Cl.
CPC ........ *H01L 21/3065* (2013.01); *H01L 21/0234* (2013.01); *H01L 21/02532* (2013.01); *H01L 21/30621* (2013.01); *H01L 21/31116* (2013.01); *H01L 21/31138* (2013.01); *H01L 21/31144* (2013.01); *H01L 21/32135* (2013.01); *H01L 21/32136* (2013.01); *H01L 21/32137* (2013.01); *H01L 21/67207* (2013.01); *H01J 2237/334* (2013.01); *H01L 21/3105* (2013.01)

(58) Field of Classification Search
None
See application file for complete search history.

(56) References Cited

U.S. PATENT DOCUMENTS

2006/0006477 A1* 1/2006 Hashimi et al. ............... 257/382
2008/0081464 A1* 4/2008 Matsuda et al. ............... 438/660
2011/0045349 A1* 2/2011 Pushparaj et al. ............. 429/212

OTHER PUBLICATIONS

H. Xiao, "Introduction to Semiconductor Manufacturing Technology", published by Prentice Hall, year 2001, ISBN 0-13-022404-9, pp. 243, 244, and 328-354.*

* cited by examiner

*Primary Examiner* — Jiong-Ping Lu
(74) *Attorney, Agent, or Firm* — Moser Taboada; Alan Taboada

(57) ABSTRACT

Methods for etching silicon using hydrogen radicals in a hot wire chemical vapor deposition process are provided herein. In some embodiments, a method of processing a substrate having a crystalline silicon layer atop the substrate and a patterned masking layer atop the crystalline silicon layer exposing portions of the crystalline silicon layer; the method may include (a) exposing the substrate to a plasma formed from an inert gas wherein ions from the plasma amorphize a first part of the exposed portions of the crystalline silicon layer; and (b) exposing the substrate to hydrogen radicals generated from a process gas comprising a hydrogen-containing gas in a hot wire chemical vapor deposition (HWCVD) process chamber to etch the amorphized first part of the exposed portion of the crystalline silicon layer.

20 Claims, 4 Drawing Sheets

METHODS FOR ETCHING SILICON USING HYDROGEN RADICALS IN A HOT WIRE CHEMICAL VAPOR DEPOSITION CHAMBER

CROSS-REFERENCE TO RELATED APPLICATIONS

This application claims benefit of U.S. provisional patent application Ser. No. 61/900,160, filed Nov. 5, 2013, which is herein incorporated by reference in its entirety.

FIELD

Embodiments of the present disclosure generally relate to methods for etching silicon material on substrates in a hot wire chemical vapor deposition (HWCVD) process.

BACKGROUND

The inventors have observed that typical silicon etch processes performed on three dimensional devices, such as a fin field effect transistor (FinFET) can result in damage to the fin, for example, due to physical damage from high energy ions, chemical damage due to corrosive gases, and inadequate selectivity to silicon oxide layer that protects the fin. In addition, the inventors noted that typical silicon etch processes often change the fin shape due to micro-loading, for example, causing tapered profiles between fins and/or erosion of fins. Lastly, the inventors have observed that post etch residue can lead to loss of fins altogether and/or the formation of irregular and poor quality epitaxial layers.

Therefore, the inventors have provided improved methods for etching silicon films.

SUMMARY

Methods for etching silicon using hydrogen radicals in a hot wire chemical vapor deposition process are provided herein. In some embodiments, a method of processing a substrate having a crystalline silicon layer atop the substrate and a patterned masking layer atop the crystalline silicon layer exposing portions of the crystalline silicon layer includes (a) exposing the substrate to a plasma formed from an inert gas wherein ions from the plasma amorphize a first part of the exposed portions of the crystalline silicon layer; and (b) exposing the substrate to hydrogen radicals generated from a process gas comprising a hydrogen-containing gas in a hot wire chemical vapor deposition (HWCVD) process chamber to etch the amorphized first part of the exposed portion of the crystalline silicon layer.

In some embodiments, a method of processing a substrate having a crystalline silicon layer atop the substrate and a patterned masking layer atop the crystalline silicon layer exposing portions of the crystalline silicon layer includes: (a) exposing the substrate to a plasma formed from an inert gas wherein ions from the plasma amorphize a first part of the exposed portions of the crystalline silicon layer, wherein the substrate is exposed to the plasma for a first period of time from about 1 seconds to about 360 seconds, and wherein a temperature of the substrate during exposure to the plasma is about 15 degrees Celsius to about 25 degrees Celsius, and a process pressure during exposure to the plasma is about 5 to about 100 mTorr; (b) exposing the substrate to hydrogen radicals generated from a process gas comprising a hydrogen-containing gas in a hot wire chemical vapor deposition (HWCVD) process chamber to etch the amorphized first part of the exposed portion of the crystalline silicon layer, wherein the substrate is exposed to hydrogen radicals for a second period of time substantially equal to the first period of time, wherein the amorphized first part of the exposed portion of the crystalline silicon layer has a thickness of about 0.5 nm to about 10 nm, and wherein a temperature of one or more filaments within the HWCVD process chamber during exposure to the hydrogen radicals is about 1200 to about 1700 degrees Celsius; and (c) repeating (a)-(b) to etch the crystalline silicon layer to a desired depth.

In some embodiments, the disclosure may be embodied in a computer readable medium having instructions stored thereon that, when executed, cause a method to be performed in a process chamber, the method includes any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
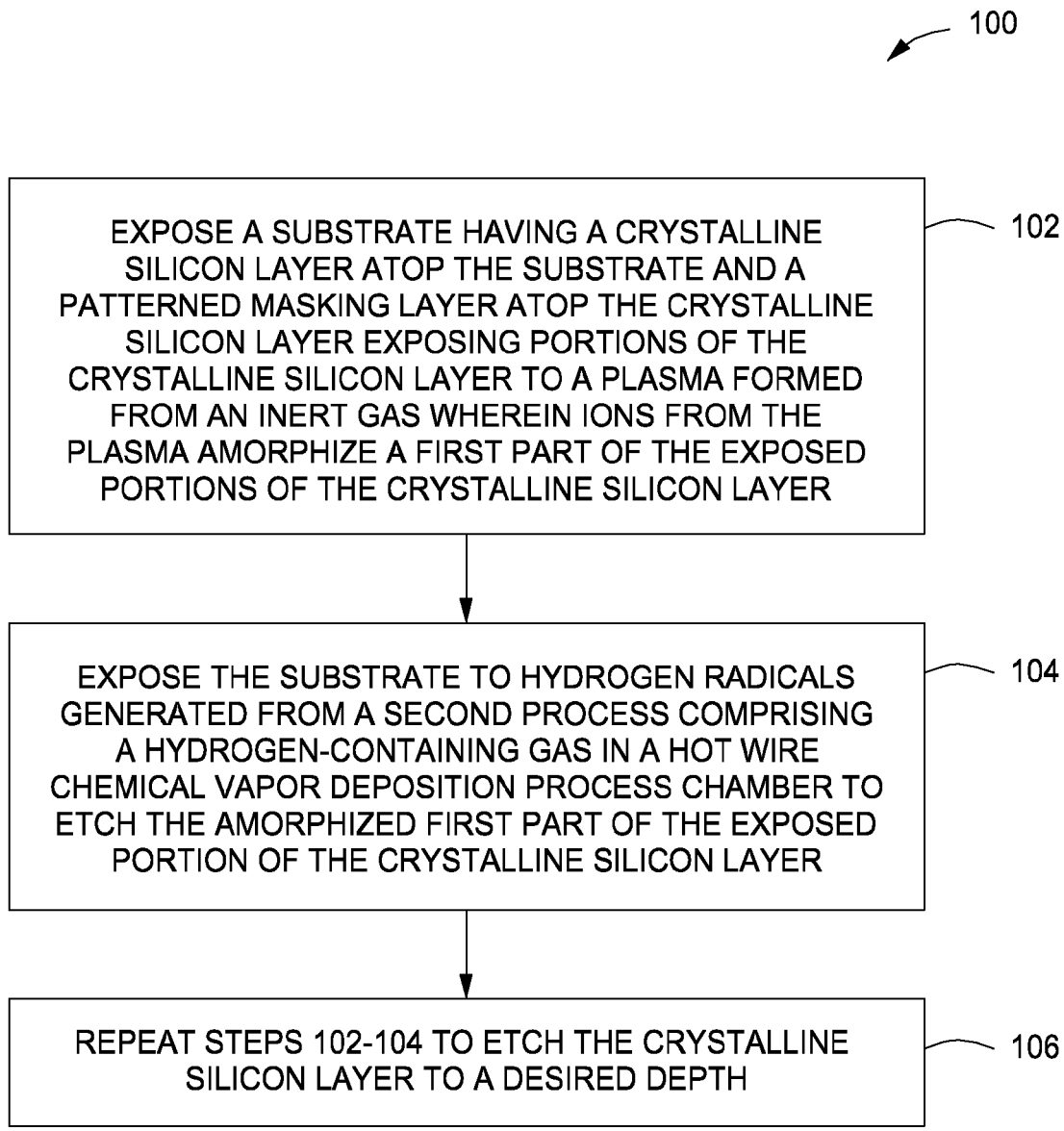
FIG. 1 depicts a flow chart for a method of etching a silicon layer in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide hot wire chemical vapor deposition (HWCVD) processing techniques useful for etching silicon films. In one exemplary application, embodiments of the present disclosure may advantageously be used to etch fin structures in fin field effect transistors (FinFET) while providing one or more of the following benefits: a reduction in fin damage, high selectivity to oxide and nitride, and residue-free etching for subsequent EPI growth. Embodiments of the present disclosure may be used to advantage for other silicon etch applications including but not limited to poly-silicon gate etch and silicon trench etch.

Figure 2A:
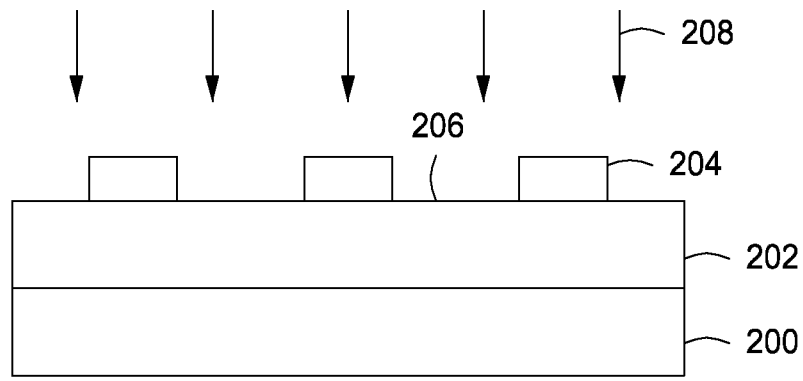
FIG. 2A-2C depicts illustrative cross-sectional views of a substrate during different stages of the method of FIG. 1 in accordance with some embodiments of the present disclosure.
Figure 2B:
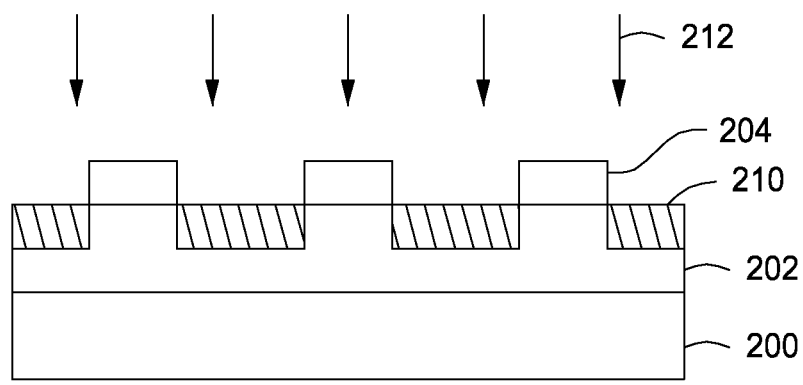
Figure 2C:
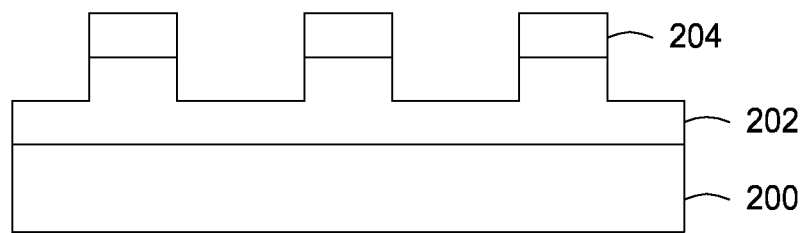

FIG. 1 depicts a flow chart for a method 100 of processing a substrate 200. FIGS. 2A-2C depict illustrative cross-sectional views of a substrate 200 during different stages of the processing sequence of FIG. 1 in accordance with some embodiments of the present disclosure.

The method begins at 102 by exposing the substrate 200 to a plasma formed from an inert gas. 102 may be performed in any suitable process chamber where an inert gas plasma can be formed. Example of suitable process chambers include, but are not limited to, an ENDURA® PVD processing chamber, an ADVANTEDGE™ line of etch reactors (such as the AdvantEdge G3 or the AdvantEdge G5), a MESA™ chamber, an ENABLER® or PRODUCER® etch chamber, or other commercially available chambers from Applied Materials, Inc., of Santa Clara, Calif. In some embodiments, the process chamber is a part of a multi-chamber processing system (e.g., a cluster tool) described below with respect to FIG. 4.

The inert gas may be one or more of argon, helium, or the like. In some embodiments, the inert gas is provided at a flow rate of about 10 sccm to about 50 sccm. In some embodiments, the inert gas is ignited to form a plasma using an RF power of about 200 watts to about 700 watts at a frequency of about 100 kHz to about 162 MHz, such as about 13.56 MHz. In some embodiments, the RF power may be pulsed at about 200 watts to about 700 watts at a duty cycle of about 20% to about 90%.

The substrate 200 may be any suitable substrate, such as a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer. In some embodiments, the substrate 200 includes one or more partially or fully fabricated semiconductor devices, for example, such as a FinFET, a fully depleted SOI device, or the like.

As depicted in FIG. 2A, the substrate 200 comprises a crystalline silicon layer 202 and a mask layer 204 disposed above the crystalline silicon layer 202. The crystalline silicon layer 202 may be formed by any process suitable for forming a crystalline silicon layer 202. In some embodiments, the crystalline silicon layer 202 is a silicon oxide ($SiO_x$) layer formed atop the substrate 200. The silicon oxide ($SiO_x$) layer may be deposited via any process suitable to deposit the silicon oxide ($SiO_x$) layer having desired characteristics (e.g., crystallinity, composition, uniformity, or the like). For example, in some embodiments, the silicon oxide ($SiO_x$) layer is deposited via chemical vapor deposition (CVD), physical vapor deposition (PVD), atomic layer deposition (ALD), or the like. In some embodiments, the silicon oxide ($SiO_x$) layer may be formed by first depositing a silicon (Si) containing layer via one of the aforementioned deposition processes, followed by a subsequent oxidation process. The silicon oxide ($SiO_x$) layer may be deposited to any thickness suitable for fabrication of a desired semiconductor device.

The mask layer 204 is deposited and patterned to expose portions 206 of the crystalline silicon layer 202. The patterned mask layer 204 may define one or more features to be etched into the substrate 200. In addition, the patterned mask layer 204 may define separate regions of varying feature density (e.g., regions of high feature density and regions of low feature density). The patterned mask layer 204 may be any suitable mask layer such as a hard mask or photoresist layer. For example, in embodiments where the patterned mask layer 204 is a hard mask, the patterned mask layer 204 may comprise silicon nitride ($Si_3N_4$), silicon oxide ($SiO_2$), titanium oxide (TiO), TiN (titanium nitride), aluminum oxide ($Al_2O_3$) or the like. Alternatively, or in combination, in some embodiments, the mask layer may comprise an amorphous carbon, such as Advanced Patterning Film (APF), available from Applied Materials, Inc., located in Santa Clara, Calif., or a tri-layer resist (e.g., a photoresist layer, a Si-rich anti-reflective coating (ARC) layer, and a carbon-rich ARC, or bottom ARC (BARC) layer), a spin-on hardmask (SOH), or the like. The patterned mask layer 204 may be formed by any process suitable to form a patterned mask layer 204. For example, in some embodiments, the patterned mask layer 204 may be formed via a patterned etch process. In some embodiments, for example where the patterned mask layer 204 will be utilized to define advanced or very small node devices (e.g., about 40 nm or smaller nodes, such as Flash memory devices), the patterned mask layer 204 may be formed via a spacer mask patterning technique, such as a self-aligned double patterning process (SADP).

In some embodiments, as depicted in FIG. 2A, ions 208 from the plasma strike the exposed portions 206 of the crystalline silicon layer 202 resulting in the amorphization of a first part 210 of the exposed portions 206. In some embodiments, the amorphized first part 210 has a thickness of about 0.5 to about 10 nm. In some embodiments, the substrate 200 is exposed to the ions 208 for a first period of time from about 1 seconds to about 360 seconds. In some embodiments, during exposure to the ions 208, the substrate 200 is maintained at a temperature of about 15 degrees Celsius to about 25 degrees Celsius. In some embodiments, during exposure of the substrate 200 to the ions 208, the process chamber is at a pressure of about 5 mTorr to about 100 mTorr.

Figure 3:
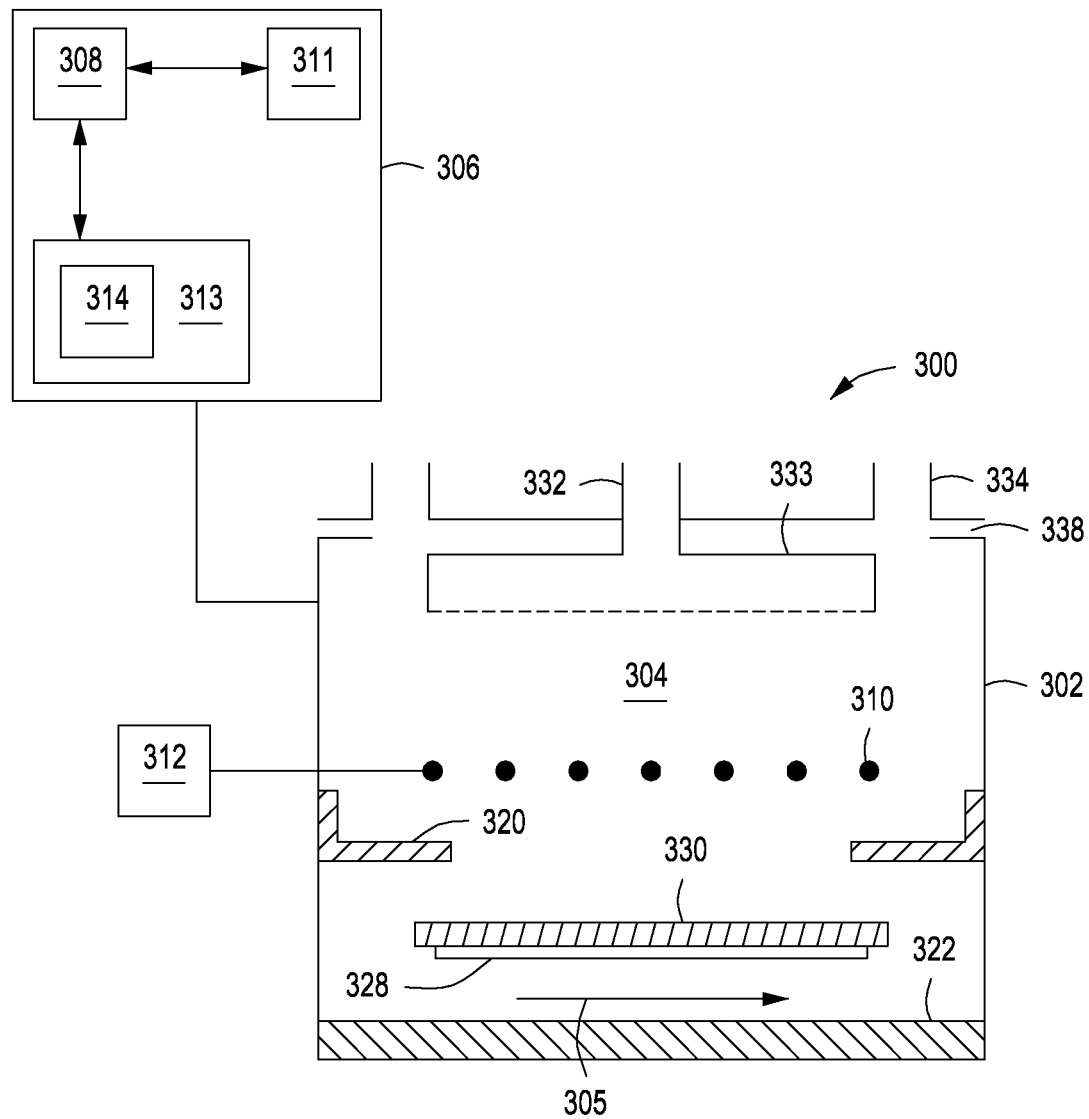
FIG. 3 depicts a schematic side view of a HWCVD process chamber in accordance with some embodiments of the present disclosure.

Next at 104, and as depicted in FIG. 2B, the substrate 200 is exposed to hydrogen radicals 212 generated from a process gas within a hot wire chemical vapor deposition (HWCVD) chamber, for example the HWCVD chamber depicted in FIG. 3. In some embodiments, the HWCVD chamber is a part of the multi-chamber processing system described below with respect to FIG. 4. The process gas comprises a hydrogen-containing gas for example hydrogen ($H_2$), or dinitrogen tetrahydride ($N_2H_4$), or ammonia ($NH_3$), or a hydrocarbon (e.g.: methylene, ethylene, or the like) or the like. In some embodiments, the flow rate of the process gas is about 400 to about 800 sccm. In some embodiments, the process gas further comprises an inert gas such as argon, helium or the like. The hydrogen radicals 212 etch the amorphized first part 210 of the crystalline silicon layer 202. In some embodiments, the substrate 200 is exposed to the hydrogen radicals 212 for a second period of time substantially equal to the first period of time. In some embodiments, the temperature of one or more filaments within the HWCVD process chamber during exposure to hydrogen radicals 212 is about 1200 to about 1700 degrees Celsius. In some embodiments, the pressure within the process chamber during 104 is about 5 to about 500 mTorr. Next at 106, 102-104 are repeated to etch the crystalline silicon layer 202 to a desired depth. Upon completion of etching the crystalline silicon layer 202 to a desired depth the substrate 200 may continue being processed, as desired, to complete the formation of structures and/or devices thereupon.

FIG. 3 depicts a schematic side view of an HWCVD process chamber 300 (e.g. process chamber 300) suitable for use in accordance with embodiments of the present disclosure. The process chamber 300 generally comprises a chamber body 302 having an internal processing volume 304. A plurality of filaments, or wires 310, are disposed within the chamber body 302 (e.g., within the internal processing volume 304). The plurality of wires 310 may also be a single wire routed back and forth across the internal processing volume 304. The plurality of wires 310 comprise a HWCVD source. The wires 310 are typically made of tungsten, although tantalum or iridium may also be used. Each wire 310 is clamped in place by support structures (not shown) to keep the wire taught when heated to high temperature, and to provide electrical contact to the wire. A power supply 312 is coupled to the wire 310 to provide current to heat the wire 310. A substrate 330 may be positioned under the HWCVD source (e.g., the wires 310), for example, on a substrate support 328. The substrate support 328 may be stationary for static deposition, or may move (as shown by arrow 305) for dynamic deposition as the substrate 330 passes under the HWCVD source.

The chamber body 302 further includes one or more gas inlets (one gas inlet 332 shown) to provide one or more process gases and one or more outlets (two outlets 334 shown) to a vacuum pump to maintain a suitable operating pressure within the process chamber 300 and to remove excess process gases and/or process byproducts. The gas inlet 332 may feed into a shower head 333 (as shown), or other suitable gas distribution element, to distribute the gas uniformly, or as desired, over the wires 310.

In some embodiments, one or more shields 320 may be provided to minimize unwanted deposition on interior surfaces of the chamber body 302. Alternatively or in combination, one or more chamber liners 322 can be used to make cleaning easier. The use of shields, and liners, may preclude or reduce the use of undesirable cleaning gases, such as the greenhouse gas $NF_3$. The shields 320 and chamber liners 322 generally protect the interior surfaces of the chamber body from undesirably collecting deposited materials due to the process gases flowing in the chamber. The shields 320 and chamber liners 322 may be removable, replaceable, and/or cleanable. The shields 320 and chamber liners 322 may be configured to cover every area of the chamber body that could become coated, including but not limited to, around the wires 310 and on all walls of the coating compartment. Typically, the shields 320 and chamber liners 322 may be fabricated from aluminum (Al) and may have a roughened surface to enhance adhesion of deposited materials (to prevent flaking off of deposited material). The shields 320 and chamber liners 322 may be mounted in the desired areas of the process chamber, such as around the HWCVD sources, in any suitable manner. In some embodiments, the source, shields, and liners may be removed for maintenance and cleaning by opening an upper portion of the deposition chamber. For example, in some embodiments, the a lid, or ceiling, of the deposition chamber may be coupled to the body of the deposition chamber along a flange 338 that supports the lid and provides a surface to secure the lid to the body of the deposition chamber.

A controller 306 may be coupled to various components of the process chamber 300 to control the operation thereof. Although schematically shown coupled to the process chamber 300, the controller may be operably connected to any component that may be controlled by the controller, such as the power supply 312, a gas supply (not shown) coupled to the inlet 332, a vacuum pump and or throttle valve (not shown) coupled to the outlet 334, the substrate support 328, and the like, in order to control the HWCVD deposition process in accordance with the methods disclosed herein. The controller 306 generally comprises a central processing unit (CPU) 308, a memory 313, and support circuits 311 for the CPU 308. The controller 306 may control the process chamber 300 directly, or via other computers or controllers (not shown) associated with particular support system components. The controller 306 may be one of any form of general-purpose computer processor that can be used in an industrial setting for controlling various chambers and sub-processors. The memory, or computer-readable medium, 313 of the CPU 308 may be one or more of readily available memory such as random access memory (RAM), read only memory (ROM), floppy disk, hard disk, flash, or any other form of digital storage, local or remote. The support circuits 311 are coupled to the CPU 308 for supporting the processor in a conventional manner. These circuits include cache, power supplies, clock circuits, input/output circuitry and subsystems, and the like. Inventive methods as described herein may be stored in the memory 313 as software routine 314 that may be executed or invoked to turn the controller into a specific purpose controller to control the operation of the process chamber 300 in the manner described herein. The software routine may also be stored and/or executed by a second CPU (not shown) that is remotely located from the hardware being controlled by the CPU 308.

Figure 4:
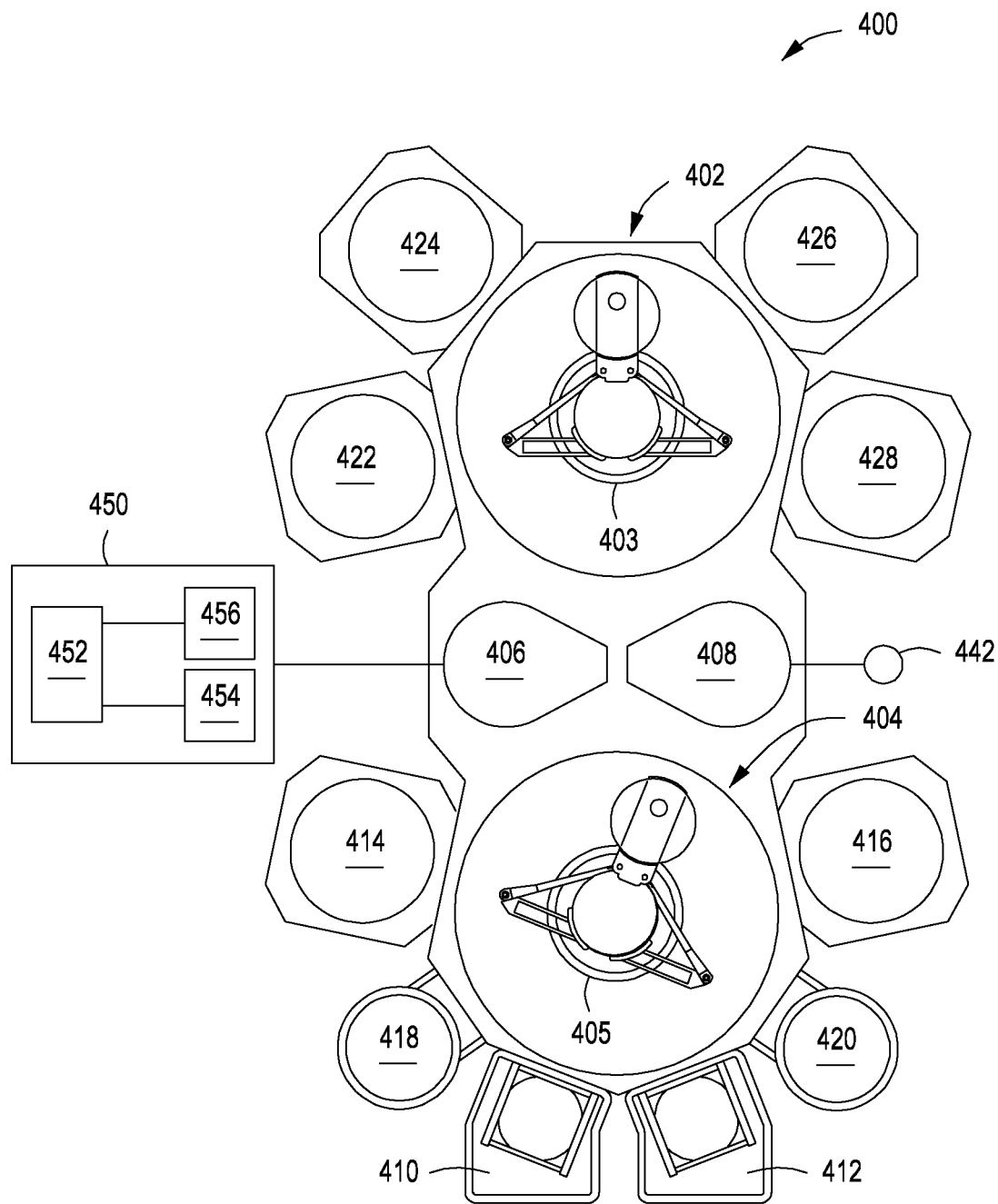
FIG. 4 depicts a schematic top view diagram of one example of a multi-chamber processing system which may be adapted to perform the processes disclosed herein.

FIG. 4 is a schematic top-view diagram of an exemplary multi-chamber processing system 400 (e.g. process system 400) in accordance with some embodiments of the present disclosure. Examples of suitable multi-chamber processing systems include the ENDURA®, CENTURA®, and PRODUCER® processing systems, commercially available from Applied Materials, Inc.

The process system 400 generally includes a first transfer chamber 402 and a second transfer chamber 404. The first and second transfer chambers 402, 404 may be vacuum chambers and may be separated by one or more intermediate load lock chambers 406, 408 coupling the second transfer chamber 404 to the first transfer chamber 402. The first and second transfer chambers 402, 404 are capable of transferring substrates to and receiving substrates from one or more process chambers coupled to the first or second transfer chambers 402, 404. At least one of the process chambers (e.g., a first process chamber) may be a HWCVD process chamber as described above and as depicted in FIG. 3.

The process system 400 may further include load lock chambers 410, 412 to transfer substrates into and out from the process system 400. For example, the load lock chambers 410, 412 may be coupled to the second transfer chamber 404 as depicted in FIG. 4. The load lock chambers 410, 412 are vacuum chambers that can be selectively "pumped down" to a vacuum pressure at or near that in the transfer chamber, or brought to a pressure at or near the ambient room pressure to facilitate entry and egress of substrates into and out of to the process system 400.

A plurality of process chambers may be coupled to the second transfer chamber 404. For example, as shown in FIG. 4, process chambers 414, 416, 418, and 420 are shown coupled to the second transfer chamber 404 (although greater or fewer process chambers may be provided). Each process chamber 414, 416, 418, and 420 may be configured to perform particular substrate processing operations such as, but not limited to, cyclical layer deposition including atomic layer deposition (ALD), chemical vapor deposition (CVD), physical vapor deposition (PVD), etch, pre-clean, de-gas, anneal, orientation, or other substrate processes.

The second transfer chamber 404 may include a second robot 405 to transfer substrates, for example substrate 200 discussed above, between the load lock chambers 410, 412, and one or more process chambers 414, 416, the one or more intermediate load lock chambers 406, 408, and other chambers 418, 420. Similarly, the first transfer chamber 402 may include a first robot 403 to transfer substrates (e.g., substrate 200) between process chambers coupled to the first transfer chamber 402 and the one or more intermediate load lock chambers 406, 408.

A plurality of process chambers may be coupled to the first transfer chamber 402. For example, as shown in FIG. 4, process chambers 422, 424, 426, and 428 are shown coupled to the first transfer chamber 402 (although greater or fewer process chambers may be provided). Similar to process chambers 414, 416, 418, and 420, the process chambers 422, 424, 426, and 428 can be configured to perform particular substrate processing operations, such as, but not limited to, cyclical layer deposition including atomic layer deposition (ALD), chemical vapor deposition (CVD), physical vapor deposition (PVD), etch, pre-clean, de-gas, anneal, orientation, or the like.

The one or more intermediate load lock chambers 406, 408 may be used to maintain ultrahigh vacuum conditions while allowing substrates to be transferred within the process system 400. The one or more intermediate load lock chambers 406, 408 may allow for independent and/or isolated ambient control between the first and second transfer chambers 402, 404. For example, the one or more intermediate load lock chambers 406, 408 may allow for the first and second transfer chambers 402, 404 to have one or more independently controlled chamber parameters. For example, the one or more independently controlled chamber parameters may include one or more of transfer chamber pressure, purge gas flow through the transfer chamber, transfer chamber moisture level, or residual gas level within the respective transfer chamber.

In some embodiments, the one or more intermediate load lock chambers 406, 408 may include a gas source 442 coupled to the one or more intermediate load lock chambers 406, 408 to expose the substrate to a gas when the substrate is placed within the one or more intermediate load lock chambers 406, 408. For example, gas source may provide a passivation gas or the like as the substrate passes through the one or more intermediate load lock chambers 406, 408 between processes. Examples of suitable gases include hydrogen sulfide ($H_2S$), ammonium sulfide ($NH_4S$), hydrogen ($H_2$), or the like. Further, the one or more intermediate load lock chambers 406, 408 may be used as cooling or heating chambers or the like. Alternatively, any of the process chambers couple to the first or second transfer chambers 402, 404 may be utilized as a cooling chamber.

A controller 450 may be coupled to the process system 400 to control the operation of the process system 400 and/or the individual components of the process system 400. The controller 450 may be one of any form of general-purpose computer processor that can be used in an industrial setting for controlling various chambers and sub-processors. The memory, or computer-readable medium, 454 of the CPU 452 may be one or more of readily available memory such as random access memory (RAM), read only memory (ROM), floppy disk, hard disk, or any other form of digital storage, local or remote. The support circuits 456 are coupled to the CPU 452 for supporting the processor in a conventional manner. These circuits include cache, power supplies, clock circuits, input/output circuitry and subsystems, and the like.

While the foregoing is directed to embodiments of the present disclosure, other and further embodiments of the disclosure may be devised without departing from the basic scope thereof.

The invention claimed is:

1. A method of processing a substrate having a crystalline silicon layer atop the substrate and a patterned masking layer atop the crystalline silicon layer exposing portions of the crystalline silicon layer; the method comprising:
    (a) exposing the substrate to a plasma formed only from at least one noble gas wherein ions from the plasma amorphize a first part of the exposed portions of the crystalline silicon layer; and
    (b) exposing the substrate to hydrogen radicals generated from a process gas comprising a hydrogen-containing gas in a hot wire chemical vapor deposition (HWCVD) process chamber to etch the amorphized first part of the exposed portions of the crystalline silicon layer.

2. The method of claim 1, further comprising exposing the substrate to the plasma for a first period of time from about 1 seconds to about 360 seconds.

3. The method of claim 2, further comprising exposing the substrate to hydrogen radicals for a second period of time substantially equal to the first period of time.

4. The method of claim 1, wherein the noble gas is argon.

5. The method of claim 1, wherein a flow rate of the noble gas is about 10 to about 50 sccm.

6. The method of claim 1, wherein a temperature of the substrate during (a) is about 15 degrees Celsius to about 25 degrees Celsius.

7. The method of claim 1, wherein a process pressure during (a) is about 5 to about 100 mTorr.

8. The method of claim 1, wherein (a) further comprises igniting the noble gas to form the plasma using an RF power of about 200 to about 700 W at a frequency of about 13.56 MHz.

9. The method of claim 1, wherein the amorphized first part of the exposed portions of the crystalline silicon layer has a thickness of about 0.5 nm to about 10 nm.

10. The method of claim 1, wherein the process gas further comprises a noble gas.

11. The method of claim 1, wherein a temperature of one or more filaments within the HWCVD process chamber during (b) is about 1200 to about 1700 degrees Celsius.

12. The method of claim 1, wherein a pressure within the process chamber during (b) is about 5 mTorr to about 500 mTorr.

13. The method of claim 1, wherein a flow rate of the process gas is about 400 to about 800 sccm.

14. The method of claim 1, further comprising repeating (a)-(b) to etch the crystalline silicon layer to a desired depth.

15. A method of processing a substrate having a crystalline silicon layer atop the substrate and a patterned masking layer atop the crystalline silicon layer exposing portions of the crystalline silicon layer; the method comprising:
    (a) exposing the substrate to a plasma formed only from at least one noble gas wherein ions from the plasma amorphize a first part of the exposed portions of the crystalline silicon layer, wherein the substrate is exposed to the plasma for a first period of time from about 1 seconds to about 360 seconds, and wherein a temperature of the substrate during exposure to the plasma is about 15 degrees Celsius to about 25 degrees Celsius, and a process pressure during exposure to the plasma is about 5 to about 100 mTorr;
    (b) exposing the substrate to hydrogen radicals generated from a process gas comprising a hydrogen-containing gas in a hot wire chemical vapor deposition (HWCVD) process chamber to etch the amorphized first part of the exposed portions of the crystalline silicon layer, wherein the substrate is exposed to hydrogen radicals for a second period of time substantially equal to the first period of time, wherein the amorphized first part of the exposed portions of the crystalline silicon layer has a thickness of about 0.5 nm to about 10 nm, and wherein a temperature of one or more filaments within the HWCVD process chamber during exposure to the hydrogen radicals is about 1200 to about 1700 degrees Celsius; and
    (c) repeating (a)-(b) to etch the crystalline silicon layer to a desired depth.

16. The method of claim 15, wherein the noble gas is argon and wherein the argon is provided at a flow rate of about 10 to about 50 sccm.

17. A method of processing a substrate having a crystalline silicon layer atop the substrate; the method comprising:
(a) patterning a masking layer formed atop the crystalline silicon layer to expose portions of the crystalline silicon layer;
(b) forming a plasma only from at least one noble gas after patterning the masking layer;
(c) exposing the exposed portions of the crystalline silicon layer to ions from the plasma to amorphize a first part of the exposed portions of the crystalline silicon layer; and
(d) exposing the amorphized first part of the exposed portions of the crystalline silicon layer to hydrogen radicals generated from a process gas comprising a hydrogen-containing gas in a hot wire chemical vapor deposition (HWCVD) process chamber to etch the amorphized first part of the exposed portions of the crystalline silicon layer.

18. The method of claim 17, wherein exposing the substrate to a plasma further comprises igniting the noble gas to form the plasma using an RF power of about 200 W to about 700 W at a frequency of about 13.56 MHz.

19. The method of claim 17, further comprising exposing the substrate to the plasma for a first period of time and exposing the substrate to hydrogen radicals for a second period of time equal to the first period of time.

20. The method of claim 17, further comprising repeating (b)-(d) to etch the crystalline silicon layer to a desired depth.

* * * * *